United States Patent
Sabia

(10) Patent No.: US 6,814,833 B2
(45) Date of Patent: Nov. 9, 2004

(54) DIRECT BONDING OF ARTICLES CONTAINING SILICON

(75) Inventor: Robert Sabia, Corning, NY (US)

(73) Assignee: Corning Incorporated, Corning, NY (US)

( * ) Notice: Subject to any disclaimer, the term of this patent is extended or adjusted under 35 U.S.C. 154(b) by 134 days.

(21) Appl. No.: 10/035,564

(22) Filed: Oct. 26, 2001

(65) Prior Publication Data

US 2003/0079822 A1 May 1, 2003

(51) Int. Cl.[7] ............................................. B32B 31/12
(52) U.S. Cl. .................... 156/281; 156/286; 156/308.8; 156/314; 156/316; 216/34; 216/97; 216/99; 216/108
(58) Field of Search ........................ 428/426, 428–429; 427/307, 309; 65/30.1, 30.12, 31, 406, 429; 216/33, 34, 97, 99, 108; 156/99, 104–105, 281, 285, 286, 308.6, 308.8, 309.3, 314, 316, 317, 318, 319; 438/455–459, 745, 749, 750, 753, 756–757

(56) References Cited

U.S. PATENT DOCUMENTS

| | | | |
|---|---|---|---|
| 4,186,999 A | 2/1980 | Harwood et al. | 350/96.21 |
| 4,530,452 A | 7/1985 | Balyasny et al. | 225/96 |
| 4,626,068 A | 12/1986 | Caldwell | 350/96.34 |
| 4,960,331 A | 10/1990 | Goldman et al. | 356/350 |
| 5,183,710 A | 2/1993 | Gerbino | |
| 5,319,483 A | 6/1994 | Krasinski et al. | 359/113 |
| 5,346,583 A | 9/1994 | Basavanhally | 156/629 |
| 5,441,803 A | 8/1995 | Meissner | 428/220 |
| 5,451,547 A | 9/1995 | Himi et al. | |
| 5,452,122 A | 9/1995 | Tsuneda et al. | 359/281 |
| 5,579,421 A | 11/1996 | Duvall et al. | 385/14 |
| 5,631,986 A | 5/1997 | Frey et al. | 385/78 |
| 5,689,519 A | 11/1997 | Fermann et al. | 372/18 |
| 5,698,471 A | * 12/1997 | Namba et al. | 156/250 |
| 5,785,874 A | 7/1998 | Eda | 216/24 |
| 5,846,638 A | 12/1998 | Meissner | 428/220 |
| 5,852,622 A | 12/1998 | Meissner et al. | 372/39 |
| 5,915,193 A | 6/1999 | Tong et al. | 438/455 |

(List continued on next page.)

FOREIGN PATENT DOCUMENTS

| | | | |
|---|---|---|---|
| DE | 2130905 | 1/1973 | H01J/19/56 |
| DE | 19731075 | 1/1999 | C03C/29/00 |
| JP | 52-78450 | 7/1977 | G02B/5/14 |
| JP | 03-115178 | 5/1991 | C04B/37/00 |
| JP | 08-146351 | 6/1996 | G02B/27/28 |
| JP | P2000-56225 A | 2/2000 | G02B/27/28 |
| JP | 2000-56265 | 2/2000 | G02B/27/28 |
| JP | 2002321947 | 4/2001 | C03C/27/00 |
| WO | WO00/17698 | 3/2000 | G02F/1/09 |
| WO | WO-01/73831 | * 10/2001 | H01L/21/30 |
| WO | WO01/98225 | 12/2001 | C03C/27/06 |

OTHER PUBLICATIONS

Arthur Landrock, Adhesives Technology Handbook, 1985, p. 117–118.*
US 2203/0079823 A1, Sabia, filed Sep. 25, 2002.*
US2003/0081906 A1 and US 2003/0081930 A1, Sabia, filed Sep. 25, 2002.*
A. Sayah, D. Solignac, T. Cueni, "Development of novel low temperature bonding technologies for microchip chemical analysis applications," Sensors and Actuators, 84 (2000) pp. 103–108.

(List continued on next page.)

Primary Examiner—Blaine Copenheaver
Assistant Examiner—Jessica Rossi
(74) Attorney, Agent, or Firm—Siwen Chen; Timothy M. Schaeberle

(57) ABSTRACT

Methods of bonding glass and silicon-containing articles are disclosed. Bonding is achieved without use of adhesives or high temperature fusion. A wide variety of glass and silicon-containing articles may be bonded by the methods of the invention.

6 Claims, 2 Drawing Sheets

U.S. PATENT DOCUMENTS

| | | | | |
|---|---|---|---|---|
| 5,932,048 | A | | 8/1999 | Furukawa et al. .......... 156/153 |
| 5,989,372 | A | | 11/1999 | Momoda et al. ......... 156/89.11 |
| 6,030,883 | A | * | 2/2000 | Nishimoto et al. ......... 438/455 |
| 6,048,103 | A | | 4/2000 | Furukata et al. .............. 385/73 |
| 6,120,917 | A | | 9/2000 | Eda ........................... 428/692 |
| 6,129,854 | A | | 10/2000 | Ramsey et al. ............... 216/18 |
| 6,153,495 | A | | 11/2000 | Kub et al. ................... 438/459 |
| 6,249,619 | B1 | | 6/2001 | Bergmann et al. ............. 385/11 |
| 6,275,336 | B1 | | 8/2001 | Yoshikawa et al. ......... 359/484 |
| 6,359,733 | B1 | | 3/2002 | Iwatsuka et al. ............ 359/500 |
| 6,429,144 | B1 | * | 8/2002 | Vines et al. ................. 438/745 |
| 6,548,176 | B1 | * | 4/2003 | Gwo ........................... 428/420 |
| 6,621,630 | B2 | | 9/2003 | Iwatsuka .................... 359/484 |
| 2002/0108556 | A1 | | 8/2002 | Ebbers ........................... 117/2 |
| 2003/0079503 | A1 | * | 5/2003 | Sabia |
| 2003/0081930 | A1 | | 5/2003 | Sabia |
| 2003/0206345 | A1 | | 11/2003 | Sabia et al. ................. 359/484 |
| 2003/0206347 | A1 | | 11/2003 | Sabia et al. ................. 359/484 |

OTHER PUBLICATIONS

P. Rangsten, O. Vallin, K. Hermansson, Y. Backlund, "Quartz–to–Quartz Direct bonding," J. Electrochemical Society, V. 146, N. 3, pp. 1104–1105, 1999).

H. Nakanishi, T. Nishimoto, M. Kani, T. Saitoh, R. Nakamura, T. Yoshida, S. Shojoi, "Condition Optimization, Reliability Evaluation of $SiO_2$–$SiO_2$ HF Bonding and Its Application for UV Detection Micro Flow Cell," Sensors and Actuators, V. 83, pp. 136–141, 2000.

A. Yamada, et al., Bonding Silicon wafer to Silicon Nitride With Spin–on Glass Adhesive, Electronics Letters, Mar. 26, 1987, vol. 23, No. 7.

D.J. Harrison, et al., Micromachining a Miniaturized Capillary Electrophoresis–Based Chemical Analysis System on a Chip, Science 261 (1993) 895–897.

W.P. Maszara, Silicon–on–insulator by Wafer Bonding: A Review, J. Electrochemical Society 138 (1991) 341–347.

D–W. Shin, et al., The Stacking Faults and Their Strain Effect at the Si/$SiO_2$ Interfaces of a Directly Bonded SOI (silicon on insulator), Thin Solid Films, V. 346, pp. 169–173, 1999.

Q–Y. Tong, et al., The Role of Surface Chemistry in Bonding of Standary Silicon Wafers, J. Electrochemical Society V. 144, N. 1, pp. 384–389, 1997.

Andreas Plobl et al., Wafer Direct Bonding: Tailoring Adhesion Between Brittle Materials, Materials Science and Engineering, R25 (1999) pp. 1–88.

* cited by examiner

DIRECT BONDING OF ARTICLES CONTAINING SILICON

FIELD OF THE INVENTION

This invention relates to direct bonding. More particularly, the invention relates to methods for direct bonding of a wide variety of articles and objects and devices produced by such methods.

BACKGROUND OF THE INVENTION

Various methods exist for bonding glass surfaces together. These methods include, for example, wringing, fusion bonding, adhesive bonding and vacuum bonding. Bonding without the assistance of polymeric adhesives is a technology of interest for numerous industries including microelectronics and photonics. Adhesives are sensitive to thermal treatments and can fail from cycling in relatively moderate thermal environments (e.g., 0–200° C.). On the other hand, the formation of a direct bond between two glass or metal surfaces allows for an impermeable seal that has the same inherent physical properties as the bulk material surfaces being bonded. For bonding of dissimilar materials, the resulting bond is sensitive only to CTE mismatches between materials, as compared to polymeric adhesives that typically have a CTE substantially different than at least one of the bulk substrates.

Optical wringing refers to a process of bonding glass surfaces in which adsorbed surface groups are removed from active bonds on a surface by heating the parts to temperatures typically above 600° C. but below the softening point of the glass. Adsorbed water and organics will vaporize and the results surface sites become "active." At such a temperature or after cooling in a clean, low humidity environment, surfaces can be placed in contact at which point covalent bonds spontaneously form between "active" bonds on each surface. This is similar to vacuum bonding, except the surface is activated by temperature rather than by a strong vacuum. A disadvantage of this process is the effect of high temperatures on polymers that may be associated with the glass article to be bonded, for example, fiber coatings and fiber array systems that utilize polymeric adhesives to bond the fiber array together.

Vacuum bonding involves bringing two clean surfaces into contact in a high vacuum, thus forming a bond. Provided that the surfaces are flat and clean, a high vacuum removes adsorbed water and hydrocarbons from the surface while preventing the adsorption of such species. Surfaces can be cleaved in the vacuum, processed and cleaned before being placed in the vacuum, or cleaned in the vacuum via ion milling or other plasma techniques. One disadvantage of this process is the effect of a high vacuum on polymers that may be associated with the glass article to be bonded, for example, fiber coatings and fiber array systems that utilize polymeric adhesives to bond the fiber array together. High vacuum pressure may have a negative effect on these polymers.

Within the microelectronics field, vacuum bonding has been developed for sealing of such materials as single crystal silicon, thermal oxide $SiO_2$ grown on Si, and various metals, as described in U.S. Pat. No. 6,153,495. Coefficient of thermal expansions (CTE) mismatch between materials is not an issue because the process can be applied at room temperature.

Fusion bonding refers to the process of cleaning two surfaces (glass or metal), bringing the surfaces into contact, and heating close to the softening point of the materials being bonded (to the lower softening temperature for two dissimilar materials), thus forming a welded interface. One example of a fusion bonding process is fusion splicing of optical fibers. Advantages of fusion bonding include the fact that commercial systems exist for splicing of fibers and that the process is relatively easy to apply to bulk geometries. One disadvantage of fusion bonding is that this process typically results in deformation of the two surfaces being bonded due to the flow of softened material, the inability to use this process for complex geometries where adhesives or other low-temperature materials are used, and loss of signal transmitted through the interface when fusion bonding is used for signal transmitting objects such as optical fibers. Furthermore, for bonding of large surfaces, it is difficult to limit glass softening to the bonding interface. As a result, the entire seal can lose dimensional tolerances. In addition, the high temperature ranges required to fusion bond many glass materials are disadvantageous for complex systems that include the use of low-temperature materials such as adhesives and polymer coatings (e.g., fiber coatings).

Adhesive bonding is a common process for mounting of fibers in ferules and for bonding of photonic components such as filters, polarizers, rotators, etc. to each other and into packages. Some advantages of using such adhesive are that they are readily available, UV curable, and allow for alignment of components between application of the adhesive and curing into permanent position. Disadvantages of adhesive bonding include CTE mismatch especially for low CTE materials such as high purity fused silica, for applications where the bonded part is exposed to thermal cycling. Another issue is signal loss from transmission through the adhesive when the adhesive is used in the optical path of optical systems. Although it is possible to utilize an index matching adhesive that has a refractive index matching the optical component, it is extremely difficult to utilize an adhesive that has a CTE and refractive index that matches the optical components. In addition, there are concerns over long-term reliability of packages that incorporate adhesives. Furthermore, bonding of components with adhesives can require angle polishing (typically 8°) and associated assembly to prevent back-reflection.

Another type of bonding process involves chemical bonding. The formation of a chemical bond between two glass or metal surfaces allows for an impermeable seal that has the same inherent physical properties as the bulk material being bonded. In literature, low-temperature bonding technology has been reported for bonding soda-lime-silicate glass and for crystalline quartz (see, e.g., A. Sayah, D. Solignac, T. Cueni, "Development of novel low temperature bonding technologies for microchip chemical analysis applications," Sensors and Actuators, 84 (2000) pp. 103–108 and P. Rangsten, O. Vallin, K. Hermansson, Y. Backlund, "Quartz-to-Quartz Direct bonding," J. Electrochemical Society, V. 146, N. 3, pp. 1104–1105, 1999). Both the Sayah and Rangsten references disclose using acid to contact the bonding surfaces. Another article, H. Nakanishi, T. Nishimoto, M. Kani, T. Saitoh, R. Nakamura, T. Yoshida, S. Shoji, "Condition Optimization, Reliability Evaluation of SiO2—SiO2 HF Bonding and Its Application for UV Detection Micro Flow Cell," Sensors and Actuators, V. 83, pp. 136–141, 2000, discloses low-temperature bonding of fused $SiO_2$ by first contacting the bonding surfaces with hydrofluoric acid. While these bonding processes are useful in certain applications, the bond strength provided by contacting with acidic solutions is limited and could be improved.

It would be desirable to provide a bonding process that does not have the disadvantages of fusion bonding, adhesive bonding, and wringing, and offers more reliable seal integrity than low pH chemical bonding. In addition, it would be useful to provide a bonding process that was durable, provided high bond strength and could be used on a wide variety of silicon-containing materials and surfaces.

SUMMARY OF INVENTION

The invention relates to methods of bonding opposing surfaces of silicon-containing articles, such as glass articles containing silica. The invention may further find use in bonding a wide variety of silicon containing materials such as single crystal silicon and crystalline quartz. According to one embodiment of the invention a method of bonding opposing surfaces of silicon-containing articles is provided. The method includes providing termination groups selected from the group consisting of $\equiv$Si—OH, $=$Si—(OH)$_2$, —Si—(OH)$_3$ and —O—Si—(OH)$_3$, and combinations thereof on the opposing surfaces of the articles and placing the opposing surfaces in contact. According to another embodiment of the invention, the temperature of the opposing surfaces can be maintained at a temperature below 300° C. during the contacting step, resulting in high bond strength and seal integrity.

According to another embodiment of the invention, the step of providing functional groups includes contacting opposing surfaces of the articles to be bonded with a high pH solution. As used herein, the term high pH means a solution having a pH of about 8 to about 13. Suitable high pH solutions include hydroxide-based solutions such as potassium hydroxide, sodium hydroxide and ammonium hydroxide. In another embodiment of the invention, the method may further include cleaning the opposing surfaces with a detergent and contacting the opposing surfaces with an acid. In still another embodiment, the opposing surfaces may also be ground and polished prior to contacting the surfaces. According to this embodiment, it may be desirable to provide a bonding surface having a flatness less than 1 micron and a roughness of less than 2.0 nm RMS, preferably less than 1.5 nm RMS.

In a preferred embodiment of the invention, the pH of the high pH solution is greater than 8, but less than 14. In a highly preferred embodiment of the invention, the step of contacting the opposing surfaces with the high pH solution is performed after the step of contacting the opposing surfaces with the acid. Suitable acids for this step may include hydrochloric acid, nitric acid and sulfuric acid. According to still another embodiment of the invention, the opposing surfaces are rinsed with water and placed in contact without drying the opposing surfaces. In a preferred embodiment, pressure of at least one pound per square inch, more preferably, at least two pounds per square inch, is applied to the opposing surfaces during the step of contacting the opposing surfaces. In another embodiment, it may be desirable to dry the surfaces to remove absorbed water molecules and to draw a slight vacuum, for example, about $10^{-3}$ millibar, to assist in the prevention of an air gap between the surfaces.

The method of the present invention is suitable for bonding a wide variety of silica-containing, glass and oxide-based surfaces. For example, the method could be used to bond waveguides, optical waveguide preforms, microlens arrays, optical fiber arrays, photonic components, lenses, ferrules, optical fiber waveguides, and combinations of these articles. For example, the invention may be utilized to bond two or more optical fiber waveguide fiber preforms together to provide for an enlarged fiber preform and continuous fiber drawing process. The invention may also be utilized to bond at least two glass tubes together that can be drawn into a dual fiber ferrule. The bonding method may be used to bond glass or silica-containing fibers with ferrules. The invention may also be used in the manufacture of optical fiber and lens arrays.

The invention provides a simple, low temperature, and inexpensive bonding method that provides a high bond strength. Bonding can occur at temperatures lower than 300° C., and in some cases lower than 100° C. The resulting seal is complete, impermeable and does not include an air gap. Additional advantages of the invention will be set forth in the following detailed description. It is to be understood that both the foregoing general description and the following detailed description are exemplary and are intended to provide further explanation of the invention as claimed.

DETAILED DESCRIPTION

Figure 1:
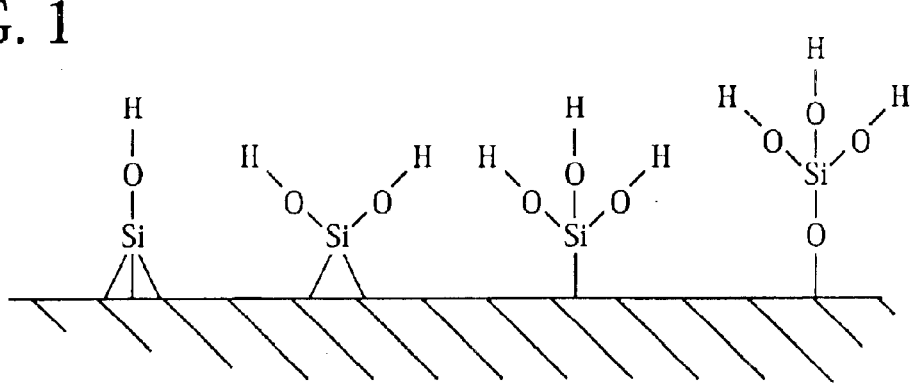
FIG. 1 is a diagram of termination groups on the surface of a silica-containing article.

The present invention relates to methods for bonding silicon containing articles. According to one embodiment of the invention, functional groups are provided on opposing surfaces of the articles to be bonded. No adhesives, high temperature treatment or caustic hydrofluoric acid or hydrogen peroxide treatments are required prior to bonding the opposing surfaces. In one embodiment of the invention, a surface treatment of a high pH base solution such as potassium hydroxide, sodium hydroxide or ammonium hydroxide is utilized to provide functional groups on the bonding surfaces of the articles. In a preferred embodiment, the surfaces are first cleaned using a detergent followed by rinsing with an acid solution such as a nitric acid solution to remove particulate contamination and soluble heavy metals respectively.

Surprisingly, it was found that cleaning and low pH treatment alone did not result in complete bonds that could be repeatably produced. In several trials, only a portion of interfaces between articles successfully bonded. However, repeatable and complete bonds could be provided by contacting the bonding surfaces with a high pH solution. According to one embodiment of the invention, the surfaces are contacted with a high pH solution, rinsed, pressed into contact and gradually heated to the desired temperature. The actual temperature will depend on a variety of factors, including, but not limited to the materials bonded, CTE mismatch between materials and the presence of polymers. The temperature treatment must be high enough and for a time sufficient to drive off the absorbed water molecules and adsorbed hydroxyl groups at the bonding interface to allow for the formation of chemical bonds. This can be done at any temperature below the softening point of the glass while preventing loss of geometrical tolerances. For example, for high purity fused silica, this temperature can be as high as approximately 1000° C., for Pyrex®, as high as about 650° C., for Polarcor® (a polarizing glass available from the assignee of the present invention), as high as about 500° C. For applications where the system includes materials such as polymeric adhesives and coatings outside of the bonding area (for example, the mounting of fibers in a fiber array), the required temperature is below that which promotes degradation or embrittlement of the polymer (typically 150–200° C., usually a maximum of around 250° C., but preferably less than 150° C.). In cases where a low temperature frit is used to seal and/or adhere components away from the directly bonded surfaces, the temperature used for direct bonding may need to be lower, and will depend upon the melting temperature of the frit.

For applications that include sealing materials with significantly different CTE values, sealing must be performed at a low enough temperature (typically less than 100° C.) such that the sealed part will not exhibit high stress when cooled to room temperature. To enhance bonding, it is highly preferred that the surfaces are flat, as determined by pre-forming a preliminary cleaning and pressing of the dried samples into contact. Resulting interference fringes can be acquired according to techniques known in the art and interpreted to determine matching flatness. Also, an optical flat or interferometer can be used to evaluate individual surface flatness. Also, interference fringes between two mating surfaces prior to bonding can be used to observe and measure conforming flatness.

Preferably, the bonding process of the present invention consists of machining each surface to be sealed to an appropriate flatness. Particularly preferred flatness levels are less than about 1 micron and roughness levels of less than about 2.0 nm RMS, preferably less than about 1.5 nm RMS. In general, it is desirable to have less than about 1 micron of conformation between the bonding surfaces, however, less conformance is acceptable if a higher amount of pressure is applied to the bonding surfaces. After polishing, each surface is preferably cleaned with an appropriate cleaning solution such as a detergent, soaked in a low pH acidic solution, and soaked in a high pH basic solution to generate a clean surface with silicic acid-like (i.e., ≡Si—OH, =Si—(OH)$_2$, —Si—(OH)$_3$ and —O—Si—(OH)$_3$) terminated surface groups. In a preferred embodiment, the surfaces are assembled without drying. However, in some embodiments it may be acceptable to moderately dry the bonding surfaces to remove absorbed water molecules, especially when using a low vacuum (e.g., about $10^{-3}$ millibar) to assist in sealing the bonding surfaces without an air gap. A low to moderate load (at least one PSI) is then applied as the surfaces are heated to less than 300° C., for example, between 100° C. and 200° C., so that absorbed water evaporates and silicic acid-like surface groups condense to form a covalently-bonded interface.

According to one embodiment of the invention, as noted above, it is desirable to provide a bonding surface that is flat. Under nominal load, relatively thin parts (1–2 mm) will elastically deform to increase contact area between non-flat surfaces, however such seals result in low failure strength due to flexure of the thin parts during mechanical testing. An issue for bonding thin parts under a nominal load is that thin parts may be stressed within the interface after bonding and subsequent removal of an applied load. Therefore, for thin parts, it is desirable to maximize flatness and provide parts having uniform thickness to maximize contact area without the need for applied load. It is preferred to have surfaces finished to 1 micron flatness or better on the surfaces to be bonded.

Contacting a clean, hydroxyl-terminated silicon-containing surface in a high pH solution (e.g. pH greater than about 8, or a pH greater than about 9) causes the surface to slowly dissolve, forming silicate species, such as, for example, $SiO_2(OH)_2^{2-}$, $SiO(OH)_3^-$, etc. in solution. Likewise, the active sites on the reacting surface are terminated by similar ≡Si—O$^-$, =Si—(O$^-$)$_2$, —Si—(O$^-$)$_3$, and —O—Si—(O$^-$)$_3$ groups. By lowering the pH of the system (e.g., rinsing in pH neutral DI-water), the surface termination groups convert to ≡Si—OH, =Si—(OH)$_2$, —Si—(OH)$_3$, and —O—Si—(OH)$_3$ termination groups (i.e., silicic acid-like surface groups, see FIG. 1 for graphical representation).

Figure 2A:
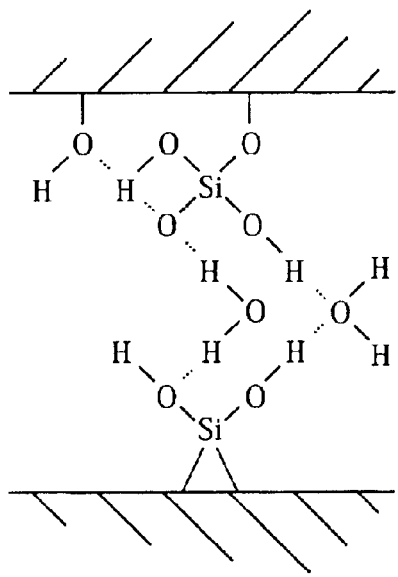
FIG. 2a is a diagram of absorbed water molecules and adsorbed hydroxyl groups on opposing surfaces after being brought into contact at room temperature.
Figure 2B:
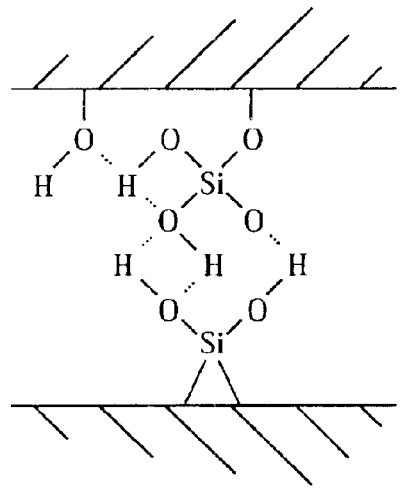
FIG. 2b is a diagram of termination groups on the surfaces shown in FIG. 2a after the surfaces have been heated to drive off absorbed water molecules.
Figure 2C:
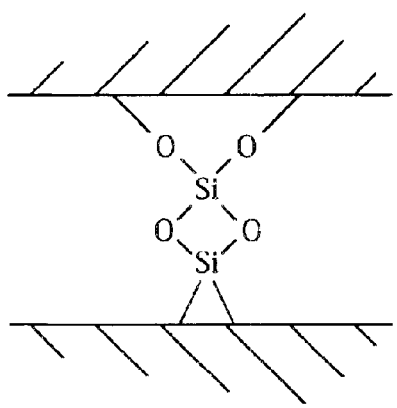
FIG. 2c is a diagram of termination groups on the surfaces shown in FIGS. 2a and 2b after the adsorbed hydroxyl groups have been removed.

After surfaces with Si—O—H termination groups are generated, water molecules spontaneously absorb from an aqueous solution onto the silicic acid-like termination groups. When two such surfaces are brought into contact, these absorbed water molecules form similar bonds to both surfaces, thus acting to bridge the surfaces with hydrogen bonds, as shown in FIG. 2a. With moderate heating, the absorbed water molecules are driven off, and hydrogen bonding exists between the silicic acid-like termination groups on each surface (see FIG. 2b). With further, higher temperature heating these silicic acid-like surface termination groups condense to form covalent bonds between the two surfaces (e.g., ≡Si—O—Si≡), with water as a byproduct (FIG. 2c).

For silicon-containing surfaces having a high percentage of silica, higher temperature heating is not necessarily required to form high strength bonds. For silica systems containing a greater amount of silica, heating below 300° C. as part of the sealing process is usually sufficient to form a high strength bond. On the other hand, samples that have a lower amount of silica in the glass composition may require heating to higher temperatures to form a satisfactory bond. For example, Pyrex® glass (containing approximately 81% silica) and Polarcor™ (containing approximately 56% silica), which are borosilicate glasses may require additional heating to provide sufficient bond strength for applications requiring high bond strength. The degree of heating for different bonding surfaces and glass surfaces will depend in part on the type of surface to be bonded (e.g., a fiber or a flat surface) and the desired bond strength for a particular application. As noted above, in systems that include polymeric materials, such as optical fiber waveguides, it is undesirable to heat the surfaces to the point where the polymeric material is damaged.

Compared with bonding systems that utilize only a low pH treatment and rely on hydroxyl terminated surface groups, it is believed the present invention provides more robust bonding between silicon-containing articles for several reasons. While not wishing to be bound by theory, it is believed that silicic acid-like termination groups allow bonding (both hydrogen and covalent) to occur between surface groups that extend further away from the surface. Larger surface terminated groups that extend further from the surface are more susceptible to steric effects that allow movement of ≡Si—OH, =Si—(OH)$_2$, —Si—(OH)$_3$, and —O—Si—(OH)$_3$ termination groups and thus easier bonding between those groups on opposing surfaces. Additionally, each surface can be considerably rougher and still generate bonding due to the length in which the ≡Si—OH, =Si—(OH)$_2$, —Si—(OH)$_3$, and —O—Si—(OH)$_3$ termination groups extend from the surface. Although termination groups specific to bulk surfaces being bonded can be formed for a variety of glass formers (e.g., $SiO_2$, $B_2O_3$) and intermediates (e.g., $Al_2O_3$), application to sealing of glass compositions that have significantly higher alkali and alkaline earth concentrations is expected to be difficult. For these types of glass compositions, high pH treatment to form surface termination groups specific to each constituent that extend from the surface (similar to silicic acid-like termination groups for silica surfaces) is expected to improve bonding performance between the surfaces.

Silicic acid-like termination groups are also more reactive than simple hydroxyl groups. In addition, the process of removing absorbed water molecules to promote hydrogen bonding between ≡Si—OH, ≡Si—(OH)$_2$, —Si—(OH)$_3$, and —O—Si—(OH)$_3$ surface groups and condensation of said groups can occur at lower temperatures (i.e., below 100° C.) or in shorter time periods at equivalent temperatures compared to hydroxyl-terminated surfaces sites. It is also believed that this process can be applied at lower pressures to attain equivalent or superior strengths compared to low pH bonding procedures that have been found to require higher pressure.

Figure 3:
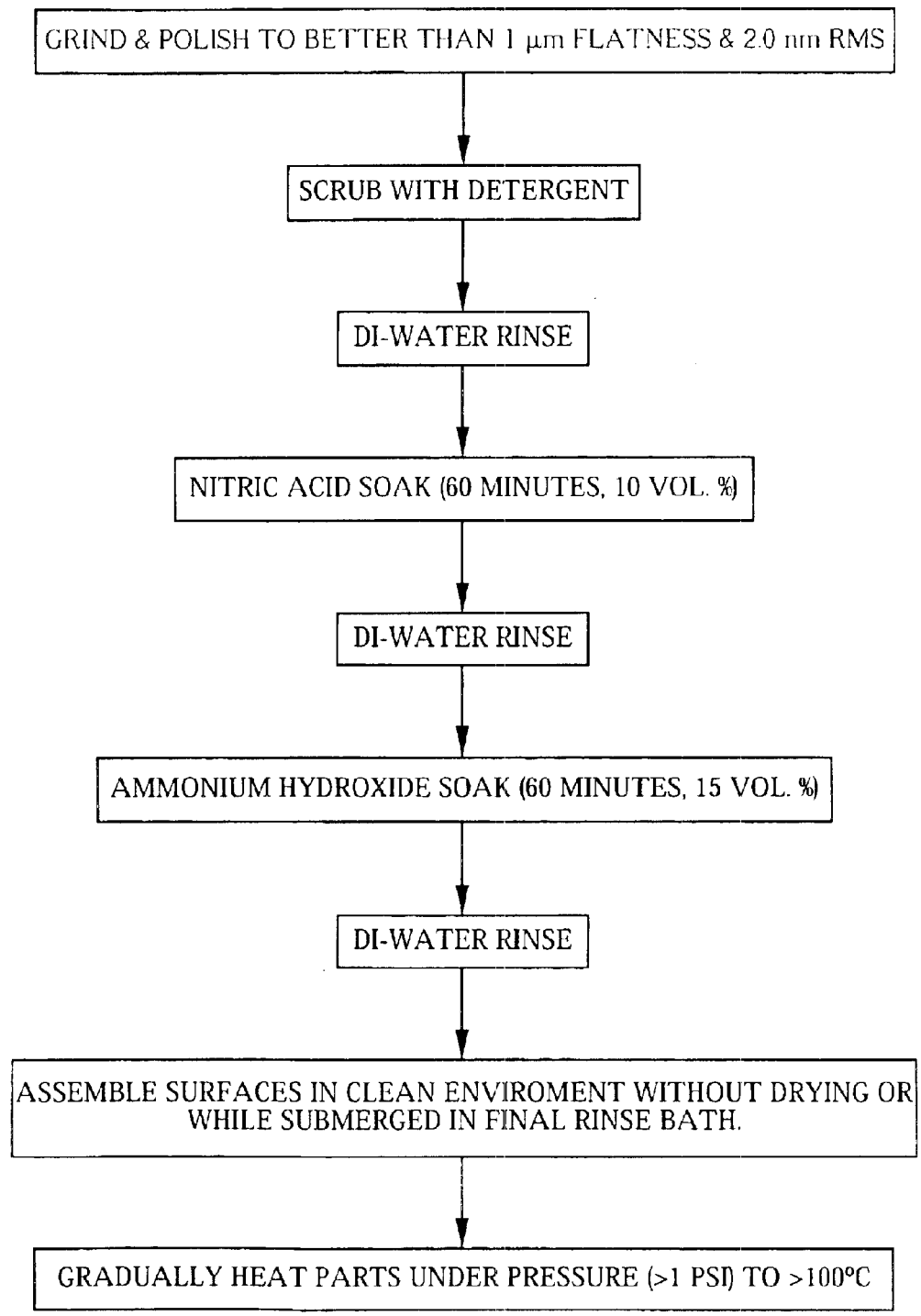
FIG. 3 is flow chart of process steps according to one embodiment of the invention.

A flow chart of the process steps of one embodiment of the invention are shown in FIG. 3. According to the present invention, the bonding surface of an article can be provided by grinding the bonding surface flat, lapping to remove grinding damage while maintaining flatness, and polishing to produce an optically clear surface without subsurface damage. The samples are then cleaned using a detergent, soaked in a strong acid such as nitric acid to remove adsorbed hydrocarbons and dissolved rare-earth contaminants (e.g., cerium oxide from the polishing step), and finally contacted with a high pH alkali solution such as ammonium hydroxide. The surfaces are then brought into contact and gradually heated to approximately 200° C. for an extended period of time before cooling and inspecting the seal. The bond interface is denoted by a lack of interference fringes. If fringes are observed, they will appear around the bonded area, indicating surface separation due to non-conformity of the surfaces.

As noted above, for certain glass compositions, it may be desirable for additional heat treatment or annealing after placing the surfaces in contact. Whether or not an annealing treatment is possible or practical depends on the presence of low temperature constituents of the component or package being bonded (e.g., presence of low-temperature softening or degrading materials such as adhesives and coatings away from the bond interface). It must also be considered that excessive heating of certain materials may result in a loss of dimensional tolerances.

Another factor to consider during bonding of glass surfaces is the solubility behavior of the glass being prepared for bonding. During cleaning, solution pH may create heterogeneous etching rates between the various glass constituents. This can lead to loss of surface quality in terms of increased roughness or generation of a pitted surface. For example, the ammonium hydroxide soak used to hydrate the glass surface has a pH between 12–13. This is high enough to cause silica in a glass surface to slowly dissolve. Extended soaking time can lead to a roughening of the surface if other constituents of the glass dissolve either faster or slower. Other suitable high pH solutions include hydroxide-based solutions such as potassium hydroxide and sodium hydroxide. Ammonium hydroxide is a weak base, and a highly concentrated solution of ammonium hydroxide will not exceed pH of approximately 13. Comparatively, sodium and potassium hydroxides are strong bases and can easily exceed pH 14, with 1M concentration for a strong base=pH 14. A 1 M concentration of KOH is typically used to clean laboratory glassware. This solution is effective in removing contaminants by dissolving the glass surface around and under the contaminant and thus allowing the contaminant to disperse in solution. This level of highly concentrated solution results in an aggressive attack of a glass surface with a high dissolution rate, and thus may not be desirable for the present invention. Alternatively, a pH such as 12–13 will thermodynamically allow for solubility of a glass surface, however, kinetically this solubility reaction proceeds at a much slower rate than for a pH 14 solution.

Likewise, the nitric acid solution has a pH near 0, and will preferentially etch lead from a lead-silicate glass. Thus, modification of the cleaning protocol might be required in terms of soak time and acid and/or alkali concentration for complex glass compositions, and these modifications can be determined by experimentation for various types of glasses.

Without intending to limit the invention in any manner, the present invention will be more fully described by the following examples.

EXAMPLES

Sample Preparation

All samples in the examples below had geometries of 2×½×¼ inches. Samples were prepared by cutting each sample to size plus an additional 0.051" in each direction. The samples were ground and polished by first grinding 0.040" from each of the four side edges of the sample to provide a parallel and flat sample. Thereafter, a 7 micron alumina abrasive was used to lap 0.010" from each of the side edges. Next, all twelve edges of each sample were chamfered. The faces were then polished with a ceria abrasive (Hastelite grade 919 or PO) with a polyurethane pad, which removed less than about 0.001" of material. The surfaces were inspected for surface roughness and flatness.

After a polished surface was obtained, the samples were chemically treated as shown in FIG. 3. A detergent such as Microclean CA05 was used to clean the samples, and after a water rinse, the sample was soaked in 10 volume % nitric acid for one hour. The acid-soaked samples were rinsed again with water, and then the samples were soaked in a 15 volume % ammonium hydroxide solution for 60 minutes. The samples were rinsed again, and the bonding surfaces were maintained in a wet condition and bonded under a pressure greater than about one pound per square inch and at a temperature noted above. In some instances, samples were further treated by annealing, which is noted in the examples below.

The bars were bonded together in the shape of a cross ("+"), and an Instron-type, computer controlled mechanical testing unit force measuring device was used to measure the force to either break the bond between the bars or the sample. Pressure was applied in an upward direction on the top bar and in a downward direction on the bottom bar. If the bars separated or delaminated, the measured force was an indication of the bond strength. If the bars broke, the source of failure in every case was observed to be a flaw of critical size away from the interface, and this was an indication that the bond strength was greater than the breaking strength of the sample.

Example 1

Bonding of High Purity Fused Silica Surfaces

Corning product code 7980 HPFS® bars were bound and the bonding between the bars at a temperature of 200° C. was strong enough so that one of the bars failed at 160.9 psi.

Example 2

Bonding of Polarcor™ Surfaces

Polarcor™ is a borosilicate glass. A proprietary polarization process makes the outer surfaces act as polarizers. Active polarization occurs in the outer 20–50 microns of the glass surface. Polarcor bars were bonded together at a bonding temperature of about 200° C. A first set of samples resulted in the bond between the bars delaminating at 45.8 psi. A second set of samples was annealed to about 500° C., and these bars failed in tension at 127.9 psi.

It will be apparent to those skilled in the art that various modifications and variations can be made to the present invention without departing from the spirit or scope of the invention. Thus, it is intended that the present invention cover modifications and variations of this invention provided they come within the scope of the appended claims and their equivalents.

What is claimed is:

1. A method of directly bonding two opposing silicon-containing surfaces, comprising the following steps in sequence:

polishing the opposing surfaces;

contacting the opposing surfaces with a detergent;

contacting the opposing surfaces with an aqueous rinse solution;

contacting the opposing surfaces with a solution of nitric acid;

contacting the opposing surfaces with a solution having a pH greater than 8 comprising ammonium hydroxide, potassium hydroxide or sodium hydroxide;

placing the opposing surfaces in contact with each other; and heating the opposing surfaces to a temperature less than 300° C.

2. The method of claim 1, further comprising a step of applying pressure of at least one pound per square inch during the step of placing the opposing surfaces in contact.

3. The method of claim 1, wherein in the step of polishing the opposing surfaces, the surfaces are polished to having a flatness less than 1 micron and a roughness less than 2.0 nm RMS.

4. The method of claim 1, wherein after the step of contacting the opposing surfaces with a solution having a pH greater than 8 but before the step of placing the opposing surfaces in contact with each other, the opposing surfaces are rinsed with water, and the opposing surfaces are placed in contact without drying.

5. The method of claim 1, wherein after the step of contacting the opposing surfaces with a solution having a pH greater than 8 but before the step of placing the opposing surfaces in contact with each other, the opposing surfaces are rinsed with water, and the opposing dried before being placed in contact.

6. The method of claim 5, wherein during the step of placing the opposing surfaces in contact with each other, a low vacuum pressure is applied to prevent air gap between the opposing surfaces.

* * * * *